US008068576B2

United States Patent
Lin et al.

(10) Patent No.: US 8,068,576 B2
(45) Date of Patent: Nov. 29, 2011

(54) COUNTERS AND EXEMPLARY APPLICATIONS

(75) Inventors: Chih-Chang Lin, San Jose, CA (US);
Tien-Chun Yang, San Jose, CA (US);
Steven Swei, Fremont, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/699,458

(22) Filed: Feb. 3, 2010

(65) Prior Publication Data

US 2010/0215139 A1    Aug. 26, 2010

Related U.S. Application Data

(60) Provisional application No. 61/154,931, filed on Feb. 24, 2009.

(51) Int. Cl.
*H03K 21/00* (2006.01)
(52) U.S. Cl. .............. 377/47; 377/48; 377/119
(58) Field of Classification Search .......... None
See application file for complete search history.

(56) References Cited

U.S. PATENT DOCUMENTS

| | | | | |
|---|---|---|---|---|
| 4,330,751 A | * | 5/1982 | Swain | 327/114 |
| 4,596,027 A | * | 6/1986 | Bernardson | 377/33 |
| 5,473,652 A | * | 12/1995 | Suwald | 377/47 |
| 5,694,066 A | * | 12/1997 | Shyong | 327/113 |
| 6,115,442 A | * | 9/2000 | Lusinchi | 377/47 |
| 6,861,881 B1 | * | 3/2005 | Neravetla et al. | 327/115 |
| 6,967,507 B2 | * | 11/2005 | Ding | 327/115 |
| 7,215,211 B2 | * | 5/2007 | Lipan et al. | 331/34 |
| 2005/0180539 A1 | * | 8/2005 | De Gouy et al. | 377/47 |

OTHER PUBLICATIONS

Wang, Hongyu et al., "A Generic Multi-Modulus Divider Architecture for Fractional-N Frequency Synthesisers", Department of Electronic and Electrical Engineering, University College London, London, United Kingdom, IEEE 2007, pp. 261-265.

* cited by examiner

*Primary Examiner* — Tuan T Lam
(74) *Attorney, Agent, or Firm* — Lowe Hauptman Ham & Berner, LLP

(57) ABSTRACT

Embodiments described herein are related to a counter. In some embodiments, the counter can be used as a divider, e.g., in a fractional PLL. In some embodiments, the counter (e.g., the main counter or counter C) includes a first counter (e.g., counter $C_1$) and a second counter (e.g., counter $C_2$), which, together with the first counter $C_1$, perform the counting function for counter C. For example, if counter C is to count to the value N, then counter $C_1$ counts, e.g., to $N_1$, and counter $C_2$ counts to $N_2$ where $N=N_1+N_2$. For counter $C_1$ to count to $N_1$, $N_1$ is loaded to counter $C_1$. Similarly, for counter $C_2$ to count to $N_2$, $N_2$ is loaded to counter $C_2$. While counter $C_1$ counts (e.g., to $N_1$), $N_2$ can be loaded to counter $C_2$. After counter $C_1$ finishes counting to $N_1$, $N_2$, if loaded, is available for counter $C_2$ to start counting to this $N_2$. Counters $C_1$ and $C_2$ can alternately count and thus provide continuous counting for counter C. Other embodiments and exemplary applications are also disclosed.

26 Claims, 4 Drawing Sheets

|     | $N_1$ | $N_1$ in Binary | $CA_1$ | $ACT_1$ |
|-----|-------|-----------------|--------|---------|
| 310 | -3    | 111101          | 0      | 1       |
| 320 | -2    | 111110          | 0      | 1       |
| 330 | -1    | 111111          | 0      | 1       |
| 340 | 0     | 000000          | 1      | 0       |

| | $N_2$ | $N_2$ in Binary | $CA_2$ | $ACT_2$ |
|---|---|---|---|---|
| 410 | -2 | 111110 | 0 | 1 |
| 420 | -1 | 111111 | 0 | 1 |
| 430 | 0 | 000000 | 1 | 0 |

COUNTERS AND EXEMPLARY APPLICATIONS

CROSS-REFERENCES TO RELATED APPLICATIONS

The present application is based on, and claims priority from, U.S. Provisional No. 61/154,931 filed Feb. 24, 2009, the disclosure of which is hereby incorporated by reference herein in its entirety.

FIELD

The present disclosure relates to counters and methods of making them.

BACKGROUND

Dividers are frequently used in Phase Locked Loops (PLLs). In an approach, a sigma-delta modulator modulates dividers for fractional PLLs, i.e., PLLs that use a fractional value divider. Various dividers receive the clock signal from a Voltage-Controlled Oscillator (VCO) and count the clock pulses with various divider numbers at the same time. The sigma-delta modulator generates a new divider number whenever the current divider finishes counting. The new divider, e.g., through a multiplexer (MUX), selects the appropriate divider output to the phase detector. Because of the many dividers that operate at very high speeds at the same time, this approach generally consumes a significant amount of the power and layout area in a semiconductor chip in comparison with other components. Furthermore, since the various dividers have different divider numbers, the outputs of these dividers are asynchronous. As a result, when a number is selected through the MUX, glitches are easily generated and thus degrade the capabilities of the PLL.

In another approach, there is one divider for the PLL. Here, the sigma-delta modulator generates a new divider number whenever the divider finishes the current counting cycle. The divider then loads this new number into its corresponding counter before performing the next counting cycle. The divider, however, cannot miss any clock pulse from the VCO. For example, if the divider counts each clock pulse at the rising of the clock, the divider must load the new divider number before the falling edge of the clock. This approach does not work well at very high speeds, e.g., above 2 (gigahertz) GHz.

In a Wan & Brennan approach, there are N sub-divider cells. Each cell divides the clock either by two (2) or three (3), which is determined by an output of a value stored in a memory, e.g., a read-only memory (ROM). This output is then updated at the rising edge of the output clock from the sub-divider cell. This approach provides a divider number ranging from $3^N$ to $2^N$, wherein N is an integer, and can be used for high speed operation. However, this approach requires a ROM for each sub-divider cell and mapping control logic to control the output sequence of the ROM. This approach is complicated and also consumes a large layout area in comparison with other elements on the semiconductor chip.

SUMMARY

Some embodiments regard an electronic circuit comprising: an input clock and an output clock; a first counter configured to receive a first clock signal from the input clock and a first value $N_1$; to count to the first value $N_1$ based on the first clock signal; and to generate a first enable signal; and a second counter configured to receive a second clock signal from the input clock and a second value $N_2$; and to count to the second value $N_2$ based on the second clock signal; wherein the first enable signal enables the second counter to start counting after the first counter stops counting.

Some embodiments regard a frequency divider, comprising: an input clock signal and an output clock signal; a first counter to count to a first value $N_1$; a second counter to count to a second value $N_2$; wherein the second counter generates the output clock signal based on an activity signal of the second counter; the activity signal of the second counter changing a logic state after the second counter starts or stop counting; a frequency of the output clock signal being a frequency of the input clock signal divided by a value N, wherein $N=N_1+N_2$.

Some embodiments regard a method comprising providing a main counter having a first counter including a first enable signal; and a second counter; wherein the first counter counts to a value $N_1$ and the second counter counts to a value $N_2$ in response to a main counter being set to count to a value N wherein $N=N_1+N_2$; and the first enable signal enabling the second counter to start counting to the value $N_2$ after the first counter finishes counting to the value $N_1$.

Other embodiments and exemplary applications are also disclosed.

BRIEF DESCRIPTION OF THE DRAWINGS

The details of one or more embodiments of the invention are set forth in the accompanying drawings and the description below. Other features and characteristics of the invention will be apparent from the description, drawings, and claims.

FIG. 4 shows a table illustrating how signal $ACT_2$ of FIG. 2 is generated.

Like reference symbols in the various drawings indicate like elements.

DETAILED DESCRIPTION

Figure 1:
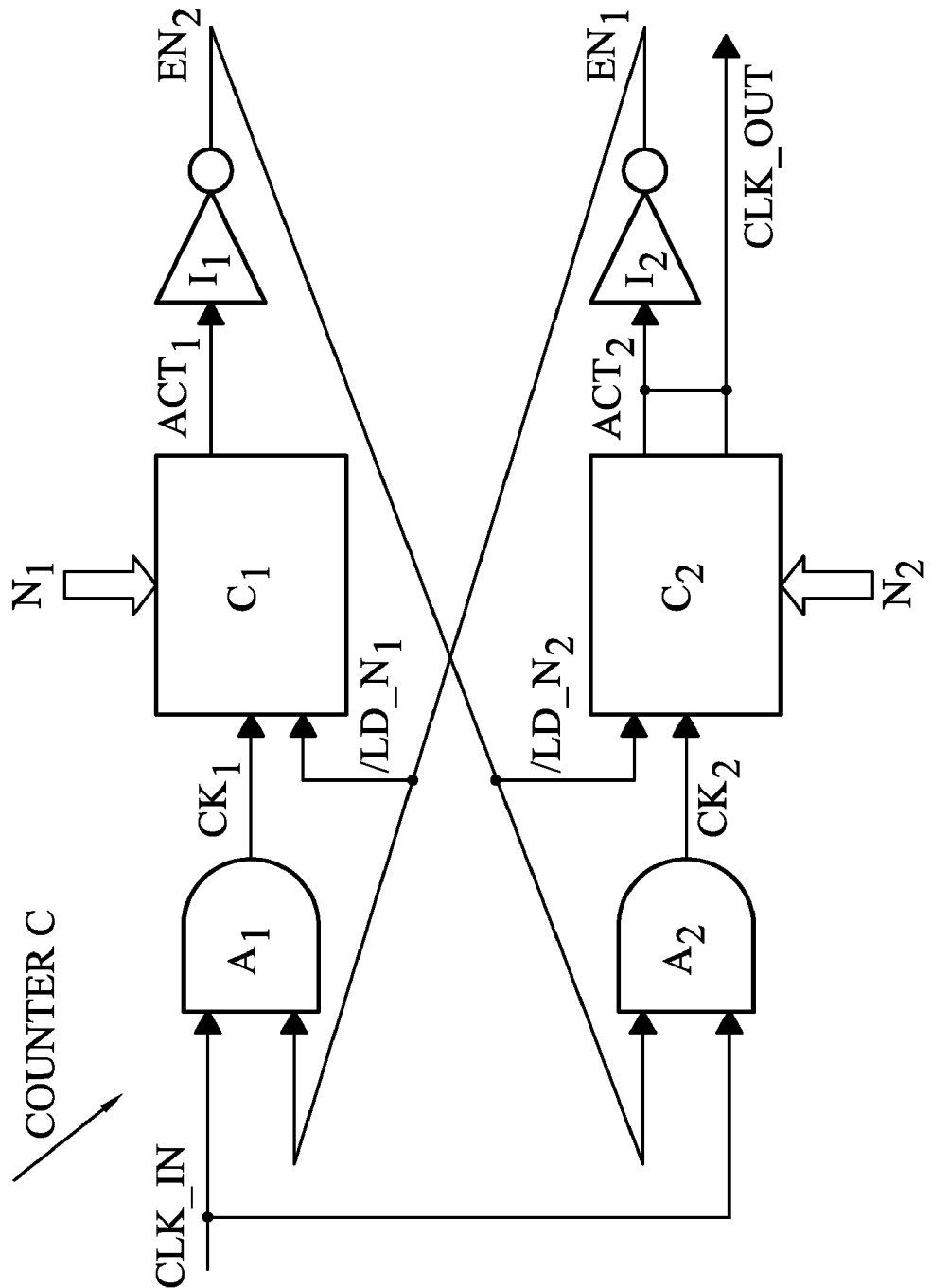
FIG. 1 shows a counter in accordance with some embodiments described herein.

In the following detailed description, for purposes of explanation, numerous specific details are set forth in order to provide a thorough understanding of one or more embodiments of the present invention. It will be apparent, however, that the embodiments of the present invention can be practiced without these specific details. In other instances, well-known structures and devices are schematically shown in order to simplify the drawing. Embodiments, or examples, described herein and illustrated in the drawings are now being described using more detailed language. It will nevertheless be understood that no limitation of the scope of the invention is thereby intended. Any alterations and modifications in the described embodiments, and any further applications of principles of the invention described in this document are contemplated as would normally occur to one of ordinary skill in the art to which the invention relates. Reference numbers may be repeated throughout the embodiments, but this does not necessarily require that feature(s) of one embodiment apply to another embodiment, even if they share the same reference number.

Embodiments of the Counter or Frequency Divider

Embodiments described herein are related to a counter. In some embodiments, the counter is used as a divider, e.g., in a fractional PLL. In some embodiments, the counter (e.g., the main counter or counter C) includes a first counter (e.g., counter $C_1$) and a second counter (e.g., counter $C_2$), which together perform the counting function for counter C. For example, if counter C counts to the number N, then counter $C_1$ counts, e.g., to $N_1$, and counter $C_2$ counts to $N_2$, wherein $N=N_1+N_2$. For counter $C_1$ to count to $N_1$, $N_1$ is loaded to counter $C_1$. Similarly, for counter $C_2$ to count to $N_2$, $N_2$ is loaded to counter $C_2$. While counter $C_1$ counts (e.g., to $N_1$), $N_2$ can be loaded to counter $C_2$. After counter $C_1$ finishes counting to $N_1$, $N_2$, if loaded, is available for counter $C_2$ to start counting. Counters $C_1$ and $C_2$ can alternately count and thus provide continuous counting for counter C.

Some embodiments described herein have one or more of the following features and/or characteristics. In some embodiments, after counter C is used as a divider in a sigma-delta fractional N PLL, the divider/counter allows the PLL frequencies to have a higher resolution without sacrificing the bandwidth so that the output clock of the PLL switches from one frequency to another frequency more quickly than other approaches. In some embodiments, the feedback divider number is not fixed. Rather the feedback divider number is changeable, e.g., before counter $C_1$ completes the counting function. In some embodiments, the feedback divider path for the sigma-delta modulator is implemented with a single divider having a sufficiently wide timing margin for the PLL to be operated at high speed, e.g., above the 2 GHz range. Even operating at high speeds, some embodiments described herein generate an irregularity-free feedback clock. In some embodiments, by using two counters $C_1$ and $C_2$ in counter C, a first counter, e.g., counter $C_1$, counts (e.g., to $N_1$) while the second counter, e.g., counter $C_2$, loads (e.g., the value $N_2$). As a result, in some embodiments, the loading and counting processes are performed in different time frames thereby solving the strict timing requirement in the prior art approaches. In some embodiments, by using a single counter C, the high power consumption and large layout area requirements of other approaches, particularly for high speed operation, are reduced.

FIG. 1 shows a counter C, in accordance with some embodiments described herein. In various embodiments, the counter C functions as a divider used in a fractional Phase Locked Loop (PLL), and/or includes one or more pipeline counters, and/or is glitch-free. Counter C receives an input a clock signal CLK_IN and provides an output clock signal CLK_OUT. Because a counter is commonly used as a frequency divider, e.g., in a PLL, counter C can be called a divider. Furthermore, if counter C divides an integer having a value N, then it is be referred to as a divide-by-N divider. For example, if the frequencies of the input clock signal CLK_IN and output clock signal CLK_OUT are $F_{IN}$ and $F_{OUT}$, respectively, then $F_{OUT}=F_{IN}/N$.

In some embodiments, counter C includes a first counter $C_1$, a second counter $C_2$, a first AND gate $A_1$, a second AND gate $A_2$, a first inverter $I_1$, and a second inverter $I_2$. Counter $C_1$ and counter $C_2$ receive input a values, e.g., $N_1$ and $N_2$, respectively, wherein both $N_1$ and $N_2$ are integers which can be the same or different. Counter $C_1$ and counter $C_2$ together perform the counting function for counter C. For example, if counter C counts to N in a time period, e.g., T, then, in time period T, counter $C_1$ counts to $N_1$, e.g., in time period $T_1$, and counter $C_2$ counts to $N_2$, e.g., in time period $T_2$, wherein $T=T_1+T_2$ and $N=N_1+N_2$. The counting result of both counters $C_1$ and $C_2$ is then reflected in output clock signal CLK_OUT, resulting in $F_{OUT}=F_{IN}/N$. Embodiments described herein are flexible in selecting $N_1$ and $N_2$ such that $N=N_1+N_2$ because either $N_1$ or $N_2$ can be arbitrarily selected and the other is determined from the equation $N=N_1+N_2$. In other words, in some embodiments, $N_1$ is arbitrarily selected and $N_2$ is determined from $N-N_1$. For example, if N is 40, and $N_1$ is arbitrarily selected as 39, then $N_2$ is therefore 1 (=40−39). For another example, if $N_1$ is arbitrarily selected as 38, then $N_2$ is 2 (=40−38), and if $N_1$ is arbitrarily selected as 37 then $N_2$ is 3 (=40−37), etc. Because N can be changed by changing either $N_1$ or $N_2$ during counting by either $C_2$ or $C_1$, respectively, changing N can be called dynamically changing or changing "on the fly."

In some embodiments, if N is dynamically changed while either counter $C_1$ or counter $C_2$ is counting, respectively, then either $N_2$ or $N_1$, respectively, is changed. Furthermore, in some embodiments, $N_1$ or $N_2$ is selected as close to N as possible so that more time is available for N to change. For example, if $N_1$ is first selected, and the initial value of N changes during the time $T_1$ that $C_1$ is counting, then $N_1$ can be selected to be as close to the initial value of N as possible so that $N_2$ can be changed, which causes N to change because $N=N_1+N_2$. In the above example, if $N_1$ is 39 while $C_1$ is counting from clock cycles 1 to 39 then $N_2$ can be changed from clock cycle 1 to clock cycle 39. If, e.g., $N_1$ is 38, then $N_2$ can be changed from clock cycle 1 to clock cycle 38, and if, e.g., $N_1$ is 37 then $N_2$ can be changed from clock cycle 1 to clock cycle 37, etc.

In some embodiments, counter $C_1$ starts counting when signal $CK_1$ is clocking, which occurs when enable signal $EN_1$ is activated (e.g., high). When activated, enable signal $EN_1$, through AND gate $A_1$, passes the input clock signal CLK_IN to signal $CK_1$. Enable signal $EN_1$ is provided by inverter $I_2$ after counter $C_2$ finishes counting to $N_2$. Counter $C_1$ provides an "activity" signal, e.g., signal $ACT_1$, to indicate whether counter $C_1$ is counting or not. For example, when counter $C_1$ is counting, it provides a high signal $ACT_1$ indicating that it is counting. Furthermore, after finishing counting to $N_1$, counter $C_1$ provides a low signal $ACT_1$ indicating that it has finished counting to $N_1$. Signal $ACT_1$, through inverter $I_1$, becomes an enable signal $EN_2$, which, together with AND gate $A_2$ provide the input clock signal CLK_IN to signal $CK_2$ that enables counter $C_2$ to start counting. For example, after finishing counting to $N_1$, counter $C_1$ provides a low to signal $ACT_1$. Inverter $I_1$ inverts the low signal $ACT_1$ to a high. That is, signal $EN_2$ is high. AND gate $A_2$, having $CK_2$ and $EN_2$ being high, passes clock signal CLK_IN to signal $CK_2$, which enables counter $C_2$ to start counting.

In various embodiments, during the time counter $C_1$ is counting, e.g., during time $T_1$, $N_2$ is loaded to counter $C_2$. For example, while counter $C_1$ is counting, signal $ACT_1$ is high making $EN_2$ low and thus signal/LD_$N_2$ low which enables loading of $N_2$ to counter $C_2$. Because counting and loading are separately performed in different time frames, some embodiments described herein eliminate the strict timing requirement in the prior art approach, e.g., where loading and counting are in the same clock cycle of the same clock. As a result, some embodiments can be used in high frequency, e.g., above the 2 GHz range, applications.

Similar to counter $C_1$, in some embodiments, counter $C_2$ starts counting when signal $CK_2$ is clocking, which occurs when enable signal $EN_2$ is activated (e.g., high). When activated, signal $EN_2$, through AND gate $A_2$, passes the input clock signal CLK_IN to signal $CK_2$. Enable signal $EN_2$ is provided by inverter $I_2$ after counter $C_1$ finishes counting to $N_1$. Furthermore, during the time counter $C_2$ is counting, e.g., during time $T_2$, $N_1$ is loaded to counter $C_1$. In the embodiment of FIG. 1, while counter $C_2$ is counting, signal $ACT_2$ is high making $EN_1$ low and thus signal/$LD\_N_1$ low and therefore enabling the loading of $N_1$ to counter $C_1$.

In some embodiments, after counter $C_2$ finishes counting, e.g., to $N_2$, it provides a signal, e.g., activity signal $ACT_2$, indicating that it has finished counting. Signal $ACT_2$, through inverter $I_2$ becomes signal $EN_1$. Signal $EN_1$, via AND gate $A_1$, passes input clock signal CLK_IN to signal $CK_1$ that enables counter $C_1$ to start counting. For example, counter $C_2$, after finishing counting, provides a low to signal $ACT_2$. Inverter $I_2$ inverts the low of signal $ACT_2$ to a high. That is, signal $EN_1$ is high. AND gate $A_1$, having CLK_IN and $EN_1$ being high, passes input clock signal CLK_IN to signal $CK_1$.

In various embodiments described herein, counters $C_1$ and $C_2$ alternately count continuously, and using counter C in some embodiments, as a result, is referred to as pipeline counting. By delegating the counting function of the main counter C to two counters $C_1$ and $C_2$, the counting and loading processes are performed in different time frames, which eliminate the strict timing requirement when loading and counting are to be done in a same clock cycle. By using a single discrete counter, e.g., counter C, the higher power consumption and/or large layout areas required by various discrete counters is/are reduced.

In the above illustration, the digital logic of various signals, e.g., $ACT_1$, $EN_1$, $ACT_2$, $EN_2$, etc., at a particular level (e.g., low or high) are used for illustration purposes. The different levels can be a design choice, and the invention is not limited to a particular level, but is applicable to different levels of the signal, depending on the circumstances.

Exemplary Signals

Figure 2:
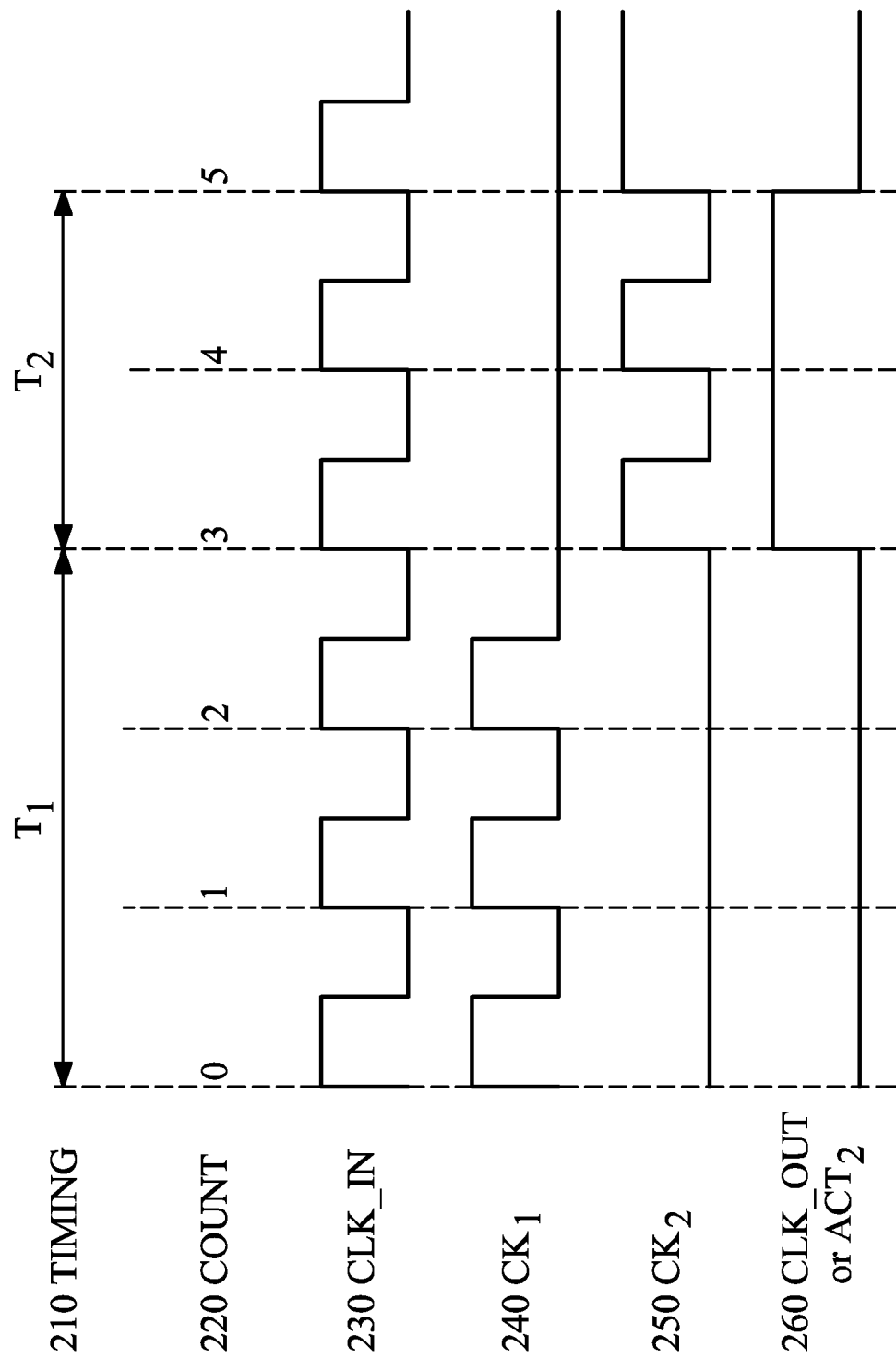
FIG. 2 shows signals illustrating operation of the counter in FIG. 1.

FIG. 2 shows signals illustrating an operation of counter C, in accordance with some embodiments. For illustration purposes, counter C is to count to 5 (N=5) wherein counter $C_1$ is to count to 3 ($N_1$=3) and $C_2$ is to count to 2 ($N_2$=2). Because counter C is to count to 5, it, as explained above, can be called a divide-by-5 counter or a divide-by-5 divider. That is, $F_{OUT}=F_{IN}/5$. For illustration purposes, each counter $C_1$ and $C_2$ counts at a rising edge of the clock, e.g., clocks CLK_IN, $CK_1$, $CK_2$, etc. Embodiments of the invention, however, are not so limited. For example, counters $C_1$ and $C_2$ may count on a falling edge of the clock, etc.

Row 210 shows timing periods $T_1$ and $T_2$ when counter $C_1$ and counter $C_2$ are counting, respectively. Row 220 shows the counts, e.g., starting at 0, and counting from 1 to 5. Rows 230, 240, and 250 show clock signals CLK_IN, $CK_1$, and $CK_2$, respectively. Row 260 shows signal $ACT_2$ or output signal clock CLK_OUT. During time $T_1$, $CK_1$ is clocking, and counter $C_1$ is counting from 0 to 1, 2 and 3. Because counter $C_2$ is not counting during this time period $T_1$, $CK_2$ is not clocking (e.g., remains low) and $ACT_2$ is low. Because output clock CLK_OUT is signal $ACT_2$, signal CLK_OUT is low. During time $T_2$ that counter $C_2$ is counting (e.g., from 4 to 5), counter $C_1$ is not counting, $CK_1$ is not clocking, and signal $ACT_2$ is high. CLK_OUT is therefore high. As compared, the frequency $F_{OUT}$ of CLK_OUT is five times less than the frequency $F_{IN}$ of CLK_IN, i.e., $F_{OUT}=F_{IN}/5$.

Loading $N_1$, $N_2$ and Signals $ACT_1$, $ACT_2$

In some embodiments, for counter $C_1$ to count to $N_1$, a negative of $N_1$ (i.e., $-N_1$) is loaded to counter $C_1$. As a result, counter $C_1$ counts from $-N_1$ to 0 and stops counting, which is the same as counting from 0 to $N_1$. Furthermore, the carry bit associated with $N_1$, e.g., bit $CA_1$, for a register that stores $N_1$, is used to generate a signal $ACT_1$. Generally, when $N_1$ is negative, the carry bit $CA_1$ remains at the same logic level, e.g., a low. When $N_1$ changes from −1 to 0, the carry bit $CA_1$ changes from a low to a high. In some embodiments, the inverse of the carry bit $CA_1$ is used to form the signal $ACT_1$. As a result, during time $T_1$ when counter $C_1$ is counting, $ACT_1$ is high and is low after time $T_1$, e.g., during time $T_2$.

Figure 3:
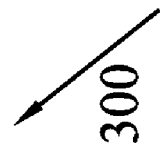
FIG. 3 shows a table illustrating how signal $ACT_1$ of FIG. 1 is generated.

FIG. 3 shows a table 300 illustrating how the signal $ACT_1$ is generated. For illustration purposes, $N_1$ is counted (or increases) from −3 to 0. Rows 310, 320, and 330 show that $N_1$ is −3, −2, and −1, respectively. During this time, carry bit $CA_1$ is 0, and as a result, signal $ACT_1$ is 1. Row 340 shows that when $N_1$ is 0, carry bit $CA_1$ changes to a 1, and as a result, signal $ACT_1$, the inverse of signal $CA_1$, is 0.

Similarly, in some embodiments, for counter $C_2$ to count to $N_2$, the negative of $N_2$ (i.e., $-N_2$) is loaded to counter $C_2$. As a result, the counter $C_2$ counts from $-N_2$ to 0, and stops counting. Furthermore, the carry bit, e.g., bit $CA_2$, for the register that stores $N_2$ is used to generate a signal $ACT_2$. Generally, when $N_2$ is negative, the carry bit $CA_2$ remains at the same logic level, e.g., a low. When $N_2$ changes from −1 to 0, the carry bit $CA_2$ changes from 0 to 1. In some embodiments, similar to the carry bit $CA_1$ in some embodiment, the inverse of carry bit $CA_2$ is used to form signal $ACT_2$.

FIG. 4 shows a graph 400 illustrating how the signal $ACT_2$ is generated in some embodiments. For illustration purposes, $N_2$ is counted (or increases) from −2 to 0. Rows 410 and 420 show that $N_2$ is −2 and −1, respectively. During this time, carry bit $CA_2$ is 0, and as a result, signal $ACT_2$ is 1. Row 430 shows that when $N_2$ is 0, carry bit $CA_2$ changes to 1, and as a result, signal $ACT_2$, the inverse of signal $CA_2$, is 0.

In the above illustration $N_1$ and $N_2$ in FIGS. 3 and 4 are shown to be 6-bit wide for illustration purposes, embodiments of the invention are applicable to various widths for either $N_1$ or $N_2$.

Exemplary Applications

Among various other applications, embodiments described herein are used in fractional PLLs, because fractional PLLs frequently change the count value (e.g., N). For example, in a PLL that desires dividing by 40.2, the divider, e.g., divider (or counter) C in the embodiment of FIG. 1, divides 4 times by 40 and 1 time by 41. That is, for another example, in each time $TT_1$, $TT_2$, $TT_3$, and $TT_4$ counter C counts 40, and in time $TT_5$ counter C counts 41. As a result, on average of the five periods $TT_1$, $TT_2$, $TT_3$, $TT_4$, and $TT_5$, the divider divides by 40.2 (=(40+40+40+40+41)/5). As can be seen in this example, the PLL desires for the count N to be changed from 40 to 41 in period $TT_4$ to $TT_5$, embodiments described herein are used to accommodate the situation. For example, $N_1$ and $N_2$ are selected such that N to be 40 in periods $TT_1$, $TT_2$, $TT_3$, and $TT_4$, and 41 in period $TT_5$. As discussed above, various combinations of $N_1$ and $N_2$ are selectable in accordance with principles of the invention such that N is 40 or 41, and N is dynamically changed. In the above example, a sigma-delta modulator works in combination with embodiments described herein to provide $N_1$ and $N_2$ for N to equal, e.g., 40 or 41. For example, if the sigma-delta modulator calls for a sequence of divider numbers (e.g., 40, 40, 40, 40, and 41 as in the above example), these numbers are inputted to counter C for it to function accordingly. In this illustrative application, some embodiments described herein allow the PLL frequencies to have higher resolution without sacrificing the bandwidth so that the output clock of the PLL can switch from one frequency to another frequency more quickly. In some embodiments, the feed back divider number (e.g., N), as explained above is not fixed, but can be changed, and thus some embodiments enable design flexibilities. In some embodiments, the feedback divider path for the sigma-delta modulator, is implemented with a single divider (or counter C) and allows the PLL to operate at high speeds, which, in some embodiments, include frequencies in the 2-3 GHz range. Even operating at high speeds, some embodiments described herein generate a glitch-free feedback clock (e.g., clock signal CLK_OUT).

A number of embodiments of the invention have been described. It will nevertheless be understood that various variations and/or modifications may be made without departing from the spirit and scope of the invention.

Each claim of this document constitutes a separate embodiment, and embodiments that combine different claims and/or different embodiments are within scope of the invention and will be apparent to those skilled in the art after reviewing this disclosure. Accordingly, the scope of the invention should be determined with reference to the following claims, along with the full scope of equivalences to which such claims are entitled.

What is claimed is:

1. A method comprising:
 providing a main counter having
  a first counter including a first enable signal, wherein the first counter is configured to operate in response to a first clock signal generated based on an input clock and a second enable signal; and
  a second counter including the second enable signal, wherein the second counter is configured to operate in response to a second clock signal generated based on the input clock and the first enable signal;
 wherein
  the first counter counts to a value $N_1$ and the second counter counts to a value $N_2$ in response to a main counter being set to count to a value N wherein $N=N_1+N_2$; and
  the first enable signal enabling the second counter to start counting to the value $N_2$ after the first counter finishes counting to the value $N_1$.

2. The method of claim 1 wherein the first enable signal changes a logic level when the first counter starts or stops counting.

3. The method of claim 1 wherein the first enable signal is generated from a carry bit associated with the value $N_1$.

4. The method of claim 1 wherein the first enable signal is generated from an activity signal.

5. The method of claim 1 wherein the first counter counts the value $N_1$ by receiving a negative value of $N_1$.

6. The method of claim 1 wherein the value $N_2$ is provided to the second counter while the first counter is counting.

7. The method of claim 1, wherein the second enable signal changes a logic level when the second counter starts or stops counting.

8. The method of claim 1, wherein the second enable signal is generated from a carry bit associated with the value $N_2$.

9. The method of claim 1, wherein the second enable signal is generated from an activity signal.

10. The method of claim 1 wherein the second counter counts the value $N_2$ by receiving a negative value of $N_2$.

11. The method of claim 1 wherein the main counter receives the input clock and provides an output clock signal wherein a frequency of the output clock signal is a frequency of the input clock being divided by the value N.

12. An electronic circuit comprising:
 an input clock and an output clock;
 a first counter configured
  to receive a first value $N_1$ and a first clock signal, wherein the first clock signal is based on the input clock and a first enable signal;
  to count to the first value $N_1$ based on the first clock signal; and
  to generate a second enable signal; and
 a second counter configured
  to receive a second value $N_2$ and a second clock signal, wherein the second clock signal is based on the input clock and the second enable signal;
  to generate the first enable signal; and
  to count to the second value $N_2$ based on the second clock signal,
 wherein the first enable signal further enables the second counter to start counting after the first counter stops counting.

13. The circuit of claim 12 being a counter to count a value N wherein $N=N_1+N_2$.

14. The circuit of claim 12 being a frequency divider wherein a frequency of the output clock is divided by a frequency of the input clock by a value N where $N=N_1+N_2$.

15. The circuit of claim 12 wherein the first enable signal changes a logic state when the first counter starts or stops counting the value $N_1$.

16. The circuit of claim 12 wherein
 the first counter is loaded with a value $-N_1$;
 the first counter counts from $-N_1$ to 0; and
 the first enable signal changes a logic state when the value $N_1$ reaches 0.

17. The circuit of claim 12 wherein the first enable signal changes a logic state based on a status of a carry signal associated with the first value $N_1$.

18. The circuit of claim 12 wherein the first enable signal is generated based on an activity signal of the first counter that changes a logic state when the first counter starts or stops counting.

19. The circuit of claim 12 wherein the second value $N_2$ is loaded based on a logic state of the first enable signal.

20. The circuit of claim 12 wherein the second counter provides the output clock signal being an activity signal of the second counter.

21. The circuit of claim 20 wherein the activity signal of the second counter changes a logic state when the second counter starts or stops counting.

22. The circuit of claim 12 wherein the second counter is further configured to provide a second enable signal that enables the first counter to start counting after the second counter stops counting.

23. A frequency divider, comprising:
 an input clock signal and an output clock signal;
 a first counter to count to a first value $N_1$ in response to a first clock signal generated based on the input clock signal and a first enable signal;
 a second counter to count to a second value $N_2$ in response to a second clock signal generated based on the input clock signal and a second enable signal;
 wherein
  the second counter generates the output clock signal based on an activity signal of the second counter;
  the activity signal of the second counter changing a logic state after the second counter starts or stop counting;
  a frequency of the output clock signal being a frequency of the input clock signal divided by a value N, wherein $N=N_1+N_2$.

24. The divider of claim 23 wherein the second counter provides the activity signal based on a carry signal associated with the value $N_2$.

25. The divider of claim 23 wherein the first counter comprises an enable signal enabling the second counter to start counting.

26. The divider of claim 23 wherein the enable signal changes a logic state when the first counter starts or stops counting.

* * * * *